US010658390B2

(12) United States Patent
Nowak et al.

(10) Patent No.: US 10,658,390 B2
(45) Date of Patent: May 19, 2020

(54) VIRTUAL DRAIN FOR DECREASED HARMONIC GENERATION IN FULLY DEPLETED SOI (FDSOI) RF SWITCHES

(71) Applicant: GLOBALFOUNDRIES INC., Grand Cayman (KY)

(72) Inventors: Edward J. Nowak, Shelburne, VT (US); Richard F. Taylor, Campbell, CA (US); Tamilmani Ethirajan, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/031,407

(22) Filed: Jul. 10, 2018

(65) Prior Publication Data

US 2020/0020721 A1 Jan. 16, 2020

(51) Int. Cl.
| | |
|---|---|
| *H01L 27/12* | (2006.01) |
| *H01L 29/10* | (2006.01) |
| *H03K 17/687* | (2006.01) |
| *H01L 21/762* | (2006.01) |
| *H03K 17/693* | (2006.01) |
| *H01L 21/84* | (2006.01) |

(52) U.S. Cl.
CPC .... *H01L 27/1207* (2013.01); *H01L 21/76224* (2013.01); *H01L 21/84* (2013.01); *H01L 29/1087* (2013.01); *H03K 17/6871* (2013.01); *H03K 17/693* (2013.01)

(58) Field of Classification Search
None
See application file for complete search history.

(56) References Cited

U.S. PATENT DOCUMENTS

| | | | |
|---|---|---|---|
| 5,818,099 A | 10/1998 | Burghartz | |
| 8,131,225 B2 | 3/2012 | Botula et al. | |
| 2006/0194558 A1 | 8/2006 | Kelly | |
| 2010/0032796 A1 | 2/2010 | Brown et al. | |
| 2010/0035403 A1 | 2/2010 | Brown et al. | |
| 2010/0156510 A1 | 6/2010 | Botula et al. | |
| 2010/0201440 A1 | 8/2010 | Nowak | |
| 2010/0244934 A1 | 9/2010 | Botula et al. | |
| 2011/0095333 A1* | 4/2011 | Park | H01L 29/66325 257/139 |
| 2012/0267719 A1 | 10/2012 | Brindle et al. | |
| 2014/0061788 A1* | 3/2014 | Chen | H01L 29/7816 257/339 |
| 2018/0090490 A1* | 3/2018 | Lin | H01L 27/0883 |

\* cited by examiner

*Primary Examiner* — Dung A. Le
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to virtual drains for decreased harmonic generation in fully depleted SOI (FDSOI) RF switches and methods of manufacture. The structure includes one or more active devices on a semiconductor on insulator material which is on top of a substrate; and a virtual drain region composed of a well region within the substrate and spaced apart from an active region of the one or more devices, the virtual drain region configured to be biased to collect electrons which would accumulate in the substrate.

14 Claims, 5 Drawing Sheets

VIRTUAL DRAIN FOR DECREASED HARMONIC GENERATION IN FULLY DEPLETED SOI (FDSOI) RF SWITCHES

FIELD OF THE INVENTION

The present disclosure relates to semiconductor structures and, more particularly, to virtual drains for decreased harmonic generation in fully depleted SOI (FDSOI) RF devices and methods of manufacture.

BACKGROUND

Semiconductor devices such as field effect transistors are employed as switching devices for radio frequency (RF) signals in analog and RF applications. Semiconductor-on-insulator (SOI) substrates are typically employed for such applications since parasitic coupling between devices through the substrate is reduced due to the low dielectric-constant of a buried insulator layer. By providing the buried insulator layer of SOI technologies, which has a dielectric-constant less than the dielectric constant of a semiconductor material in a bulk substrate, the SOI substrate reduces capacitive coupling between an individual semiconductor device and the substrate, and consequently, reduces secondary capacitive losses to the substrate.

However, even with the use of a SOI substrate, the secondary capacitive coupling of electrical signals between semiconductor devices is significant due to the high frequency range employed in the radio frequency applications, which may be, for example, from about 900 MHz to about 80 GHz, and may include even higher frequency ranges. This is because the effect of capacitive coupling between electrical components increases linearly with frequency.

For a RF switch formed on an SOI substrate, the semiconductor devices comprising the RF switch and the signal processing units in a top semiconductor layer are capacitively coupled through the buried insulator layer to a bottom semiconductor layer. Even if the semiconductor devices in the top semiconductor layer employ a power supply voltage from about 3V to about 9V, the transient signals and signal reflections in an antenna circuitry may increase the actual voltage in the top semiconductor layer up to as high as 30V. Such voltage conditions induce a significant capacitive signal-voltage coupling between the semiconductor devices subjected to such high voltage signals and an induced charge layer within an upper portion of the bottom semiconductor layer, which changes in charge density and charge polarity at the frequency of the RF signal in the semiconductor devices in the top semiconductor layer.

The induced charge layer capacitively couples with other semiconductor devices in the top semiconductor layer including the semiconductor devices that an RF switch is supposed to isolate electrically. The spurious capacitive coupling between the induced charge layer in the bottom semiconductor layer and the other semiconductor devices provides a secondary capacitive coupling, which is a parasitic coupling that reduces the effectiveness of the RF switch. In this case, the RF signal is applied to the other semiconductor devices through the secondary capacitive coupling although the RF switch is turned off.

Further, during one half of each frequency cycle of the RF signal, the top portion of the bottom semiconductor layer directly underneath the buried insulator layer is in a depletion condition, in which charge carriers in the bottom semiconductor layer are repelled from the bottom surface of the buried insulator layer. For example, when the conductivity type of the bottom semiconductor layer is p-type and the voltage of the top semiconductor portions is positive relative to the voltage at the bottom semiconductor layer, or when the conductivity type of the bottom semiconductor layer is n-type and the voltage of the top semiconductor portions is negative relative to the voltage at the bottom semiconductor layer, the majority charge carriers, i.e., holes if the bottom semiconductor layer is p-type or electrons if the bottom semiconductor layer is n-type, are repelled from the upper portion of the bottom semiconductor layer to form the induced charge layer, which is depleted of the majority charges.

Moreover, when the magnitude of the voltage differential between the top semiconductor portions and the bottom semiconductor layer is sufficiently great, an inversion layer including minority charges, i.e., electrons if the bottom semiconductor layer is p-type or holes if the bottom semiconductor layer is n-type, is formed within the induced charge layer. The inversion of the semiconductor portions adds to RF coupling to source/drain regions, degrades isolation, increases harmonic distortion and produces erratic DC behavior (e.g. kinks, non-monotonic Vt (Vbg), layout sensitivities).

SUMMARY

In an aspect of the disclosure, a structure comprises: one or more active devices on a semiconductor on insulator material which is on top of a substrate; and a virtual drain region comprising a well region within the substrate and spaced apart from an active region of the one or more devices, the virtual drain region configured to be biased to collect electrons which would accumulate in the substrate.

In an aspect of the disclosure, a structure comprises: a substrate; an insulating material on the substrate; a fully depleted semiconductor material on the insulating material; a plurality of active devices on the fully depleted semiconductor material; a virtual drain region within the substrate; and a contact which biases the virtual drain region to collect electrons from beneath the plurality of active devices In an aspect of the disclosure, a method comprises: forming one or more active devices on a semiconductor on insulator material which is on top of a substrate; and forming a virtual drain region composed of a well region within the substrate and spaced apart from an active region of the one or more devices, the virtual drain region being configured to be biased to collect electrons which would accumulate in the substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to virtual drains for decreased harmonic generation in fully depleted SOI (FDSOI) RF switches and methods of manufacture. More specifically, the present disclosure provides an FDSOI solution with a well region (e.g., virtual drain) in a semiconductor layer adjacent to a device. In embodiments, the well region is designed to draw out or collect electrons from a region beneath the device(s), e.g., oxide and/or substrate. Advantageously, by providing the well region, the virtual drain described herein prevents an inversion of the substrate beneath the buried oxide layer (e.g., BOX).

The virtual drain region (e.g., n-type well region) of the present disclosure can be manufactured in a number of ways using a number of different tools. In general, though, the methodologies and tools are used to form structures with dimensions in the micrometer and nanometer scale. The methodologies, i.e., technologies, employed to manufacture the virtual drain with the n-type region of the present disclosure have been adopted from integrated circuit (IC) technology. For example, the structures are built on wafers and are realized in films of material patterned by photolithographic processes on the top of a wafer. In particular, the fabrication of the virtual drain with the n-type region uses three basic building blocks: (i) deposition of thin films of material on a substrate, (ii) applying a patterned mask on top of the films by photolithographic imaging, and (iii) etching the films selectively to the mask.

Figure 1:
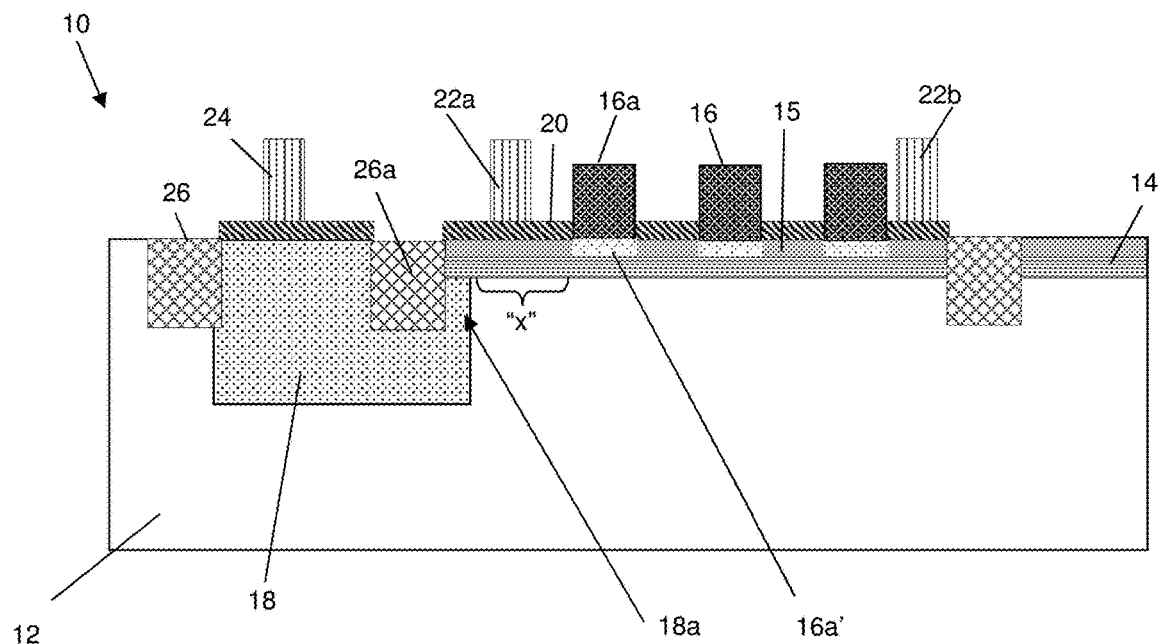
FIG. 1 shows a virtual drain for decreased harmonic generation in fully depleted SOI (FDSOI) RF switches, and respective fabrication processes, in accordance with aspects of the present disclosure.

FIG. 1 shows a virtual drain for decreased harmonic generation in fully depleted SOI (FDSOI) RF switches, and respective fabrication processes, in accordance with aspects of the present disclosure. More specifically, the structure 10 of FIG. 1 includes a substrate 12 composed of any suitable material including, but not limited to, Si, SiGe, SiGeC, SiC, GaAs, InAs, InP, and other III/V or II/VI compound semiconductors. In embodiments, the substrate 12 can be ion implanted with boron, as an example, to achieve a doping density of 1E15 $cm^{-3}$. An insulator layer 14, e.g., oxide layer, is provided on a surface of the substrate, with a semiconductor layer 15 provided on the oxide layer 14. In embodiments, the insulator layer 14 can be a buried oxide layer with a thickness of about 200 Å and the semiconductor layer 15 can be a fully depleted silicon on insulator (SOI) layer. In embodiments, the semiconductor layer 15 can be any suitable material including, but not limited to, Si, SiGe, SiGeC, SiC, GaAs, InAs, InP, and other III/V or II/VI compound semiconductors. In more specific embodiments, the semiconductor layer 15 is a fully depleted SOI substrate.

Still referring to FIG. 1, a plurality of devices 16, 16a are formed on the semiconductor layer 15. In embodiments, the plurality of devices 16, 16a can be gate structures and, more particularly, RF switches. The plurality of devices 16, 16a are preferably formed by gate first processes known to those of skill in the art. For example, in embodiments, the plurality of devices 16, 16a are composed of several materials including gate dielectric material deposited on the semiconductor layer 15. In embodiments, the gate dielectric material can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material can be deposited by any appropriate deposition method including, for example, atomic layer deposition (ALD).

Following the deposition of the gate dielectric material, a workfunction metal and gate metal material are deposited on the gate dielectric material. A capping material, e.g., nitride, can be deposited on the gate metal material. In embodiments, the workfunction metal, gate metal material and capping material are deposited by any known appropriate deposition method, e.g., chemical vapor deposition (CVD). The materials, e.g., gate dielectric material, workfunction metal, gate metal material and capping material, are patterned using a conventional lithography and etching process, e.g., reactive ion etching, to form the gate structure. Sidewall/spacer structures are formed on the patterned gate structures using conventional deposition processes (e.g., using nitride and/or oxide) and anisotropic etching processes.

FIG. 1 further shows the formation of a well region 18 within the substrate 12. In embodiments, the well region 18 (e.g., virtual drain region) can be formed before or after the devices 16, 16a using conventional ion implantation processes or diffusion processes well known to those of skill in the art such that no further explanation is required to understand the invention. In embodiments, the well region 18 extends below a surface of shallow trench isolation region 26a and, in embodiments, extends beyond the shallow trench isolation region 26a and overlaps with source/drain regions (e.g., source or drain region 20) of the device 16a as shown at reference numeral 18a. Also, the well region 18 is spaced apart from the active channel region 16a' of the device 16a to prevent any electrical interference, e.g., prevent back-gating of the SOI nFET device (e.g., device 16a). For example, the spacing "x" between the well region 18 and the device 16a can be about 1 microns to 2 microns; although other spacing is also contemplated herein depending on the technology nodes. For example, the spacing "x" should be larger than the depletion region of the substrate 12.

In embodiments, the well region 18 is oppositely doped from the substrate 12. By way of example, the well region 18 is a N-well when the substrate is p-doped (and vice versa). For example, the N-well 18 can be doped with, e.g., phosphorous or arsenic. This allows the well region 18 to act as a virtual drain for collecting electrons from the substrate 12 during the on state of the devices 16, 16a and, hence, preventing an inversion layer from occurring with the semiconductor layer 15.

FIG. 1 further shows the shallow trench isolation regions 26a, 26, which are formed by conventional lithography, etching and deposition processes. In embodiments, the shallow trench isolation regions 26a, 26 can be oxide material filled in shallow trenches, using conventional CVD processes. The shallow trench isolation region 26a is completely within the well region 18. Source and drain regions 20 are formed on sides of the devices 16, 16a. In embodiments, the source and drain regions 20 can be raised source and drain regions formed by a doped epitaxial process or ion implantation.

The source and drain regions 20 are silicided to form contacts (also shown at reference numeral 20). As should be understood by those of skill in the art, the silicide process begins with deposition of a thin transition metal layer, e.g., nickel, cobalt or titanium, over fully formed and patterned semiconductor devices (e.g., doped or ion implanted source and drain regions 20. After deposition of the material, the structure is heated allowing the transition metal to react with exposed silicon (or other semiconductor material as described herein) in the active regions of the semiconductor device (e.g., source and drain region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

Metal contacts 22a, 22b are formed on the silicide of the source and drain regions 20. The metal contacts 22a, 22b can be biased respectively by $V_{101}$ and $V_{102}$. In further embodiments, a metal contact 24 is formed on silicide regions over the well region 18. In embodiments, the metal contact 24 can be biased by a positive voltage, e.g., above $V_{101}$, in order for the virtual drain (well region 18) attract or collect electrons from the substrate 12. More specifically, the metal contact 24 will bias the well region 18 at a positive voltage as, e.g., at least as the DC-averaged RF voltage plus a bulk threshold above ground. By collecting the electrons as they are formed under the devices 16, 16a it is now possible to prevent an inversion layer of the semiconductor layer 15.

FIGS. 2-5 show different configurations of the virtual drain for decreased harmonic generation in FDSOI RF switches, and respective fabrication processes, in accordance with additional aspects of the present disclosure. It should be recognized by those of skill in the art that any combination of features of FIGS. 2-5 can be combined together in order to achieve the benefits of the device described herein. For example, as described in more detail below, any combination of an additional metal line, metal gate and/or doped liner on the shallow trench isolation structure 26a can be used together with the virtual drain, e.g., well region 18.

Figure 2:
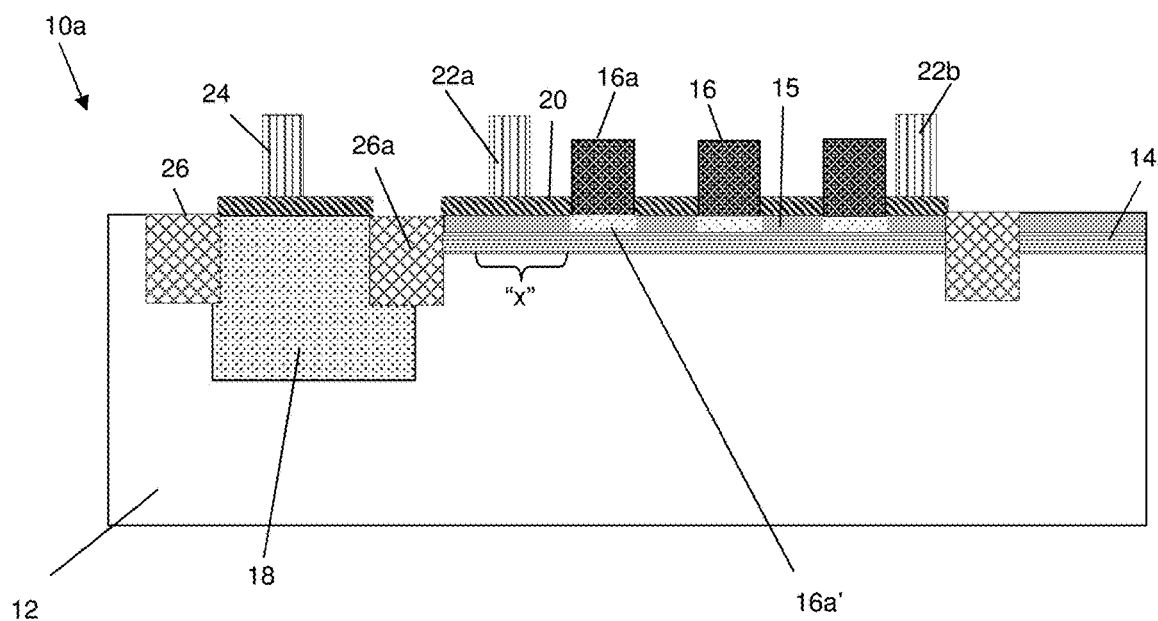
FIGS. 2-5 show different configurations of the virtual drain for decreased harmonic generation in FDSOI RF switches, and respective fabrication processes, in accordance with additional aspects of the present disclosure.

More specifically, the structure 10a of FIG. 2 shows an edge of the well region 18 overlapping with the shallow trench isolation region 26a, e.g., an edge of the well region 18 is within the confines of the shallow trench isolation region 26a. In this embodiments, the well region 18 is spaced apart from the entire active region of the device 16a, e.g., FDSOI NFET, including the source and drain regions 20. In this way, the well region 18 is now farther from the device 16a, compared to the structure 10 shown in FIG. 1. As should be understood, the placement of the well region 18 will increase the breakdown voltage while also avoiding inference with the device 16a. The remaining features of the structure 10a are the same as described with respect to the structure 10 of FIG. 1.

Figure 3:
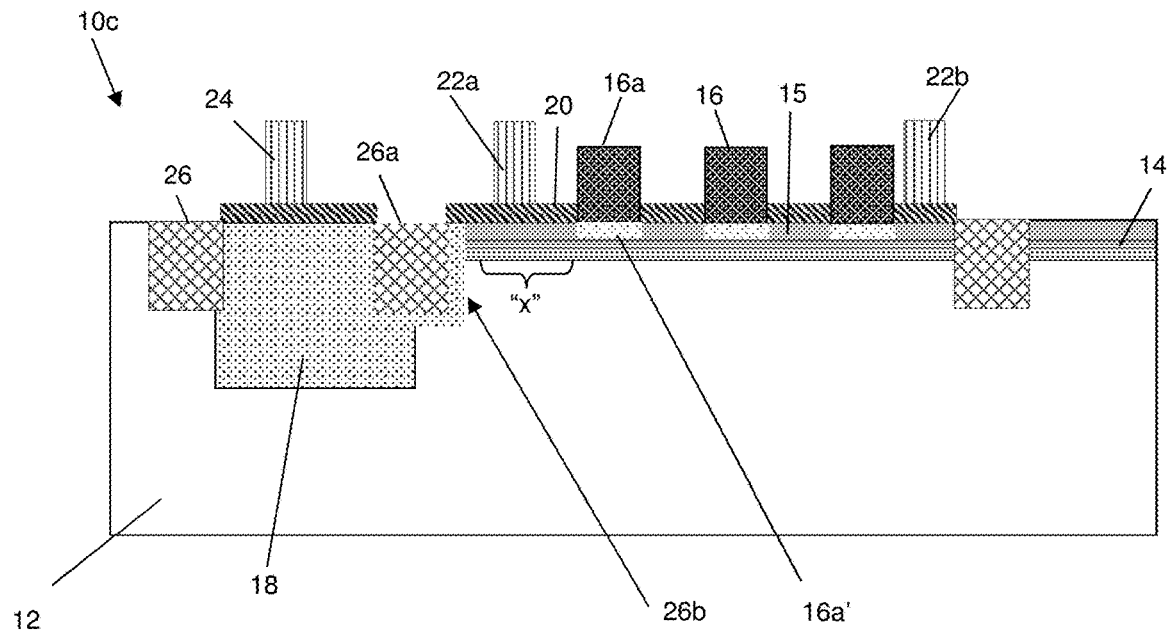

In FIG. 3, the structure 10b is similar to the structure 10a of FIG. 2, with the exception that the shallow trench isolation region 26a is doped on its sidewalls with dopant material 26b. That is, a skin of dopant material 26b is added to the shallow trench isolation region 26a, closest to the device 16a. In embodiments, the skin of dopant material 26b will enhance the conductivity of the shallow trench isolation region 26a to more efficiently collect the electrons in the substrate 12. In embodiments, the dopant is the same dopant type as the well region 18. Preferably, though, the dopant concentration of the skin of dopant material 26b is low enough to still allow a high voltage breakdown, e.g., 1E18. An alternate method of achieving the thin n-region 26b comprises addition of a low-energy n-type implantation employing, e.g., As, Sb, or P, to dope the sidewalls of the STI trench lightly n-type, typically 1E17-5E18 cm$^{-3}$. The remaining features of the structure 10b are the same as described with respect to the structure 10a of FIG. 2.

Figure 4:
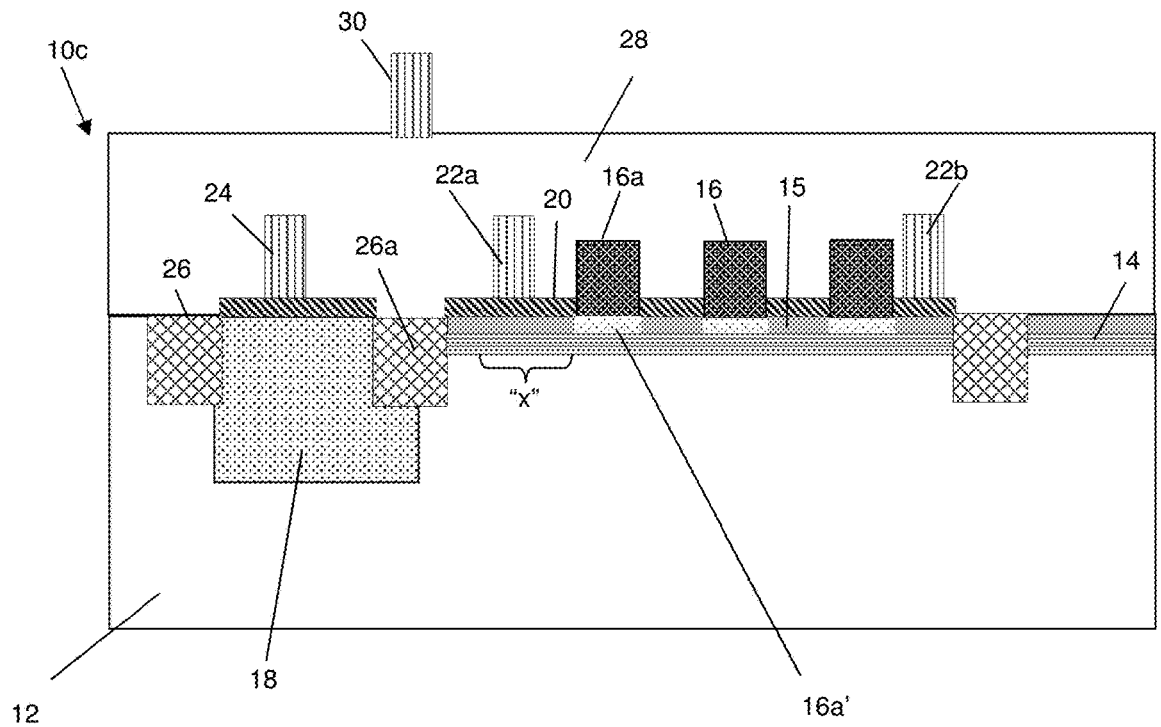

In FIG. 4, the structure 10c is similar to the structure 10a of FIG. 2, with the exception that a metal line 30 is formed above the well region 18 (on top of dielectric material 28). In embodiments, the metal line 30 is connect to a voltage source, e.g., above Vt and below the voltage applied to the contact 24. Illustratively, the metal line 30 can be biased at 0.4V and the well region at 0.8 V. In operation, the voltage source is applied to the shallow trench isolation region 26a in order for it to be more conductive, hence collecting electrons at its corner 26c. For example, the metal line 30 (e.g., metal gate (M1)) will conduct the inversion to virtual drain (e.g., well region 18) during down-going RF cycles when the voltage induced in the substrate drops below the applied voltage to the metal line 30 less the bulk threshold voltage (i.e. the threshold voltage of metal line 30 with respect to the substrate). The remaining features of the structure 10c are the same as described with respect to the structure 10a of FIG. 2.

Figure 5:
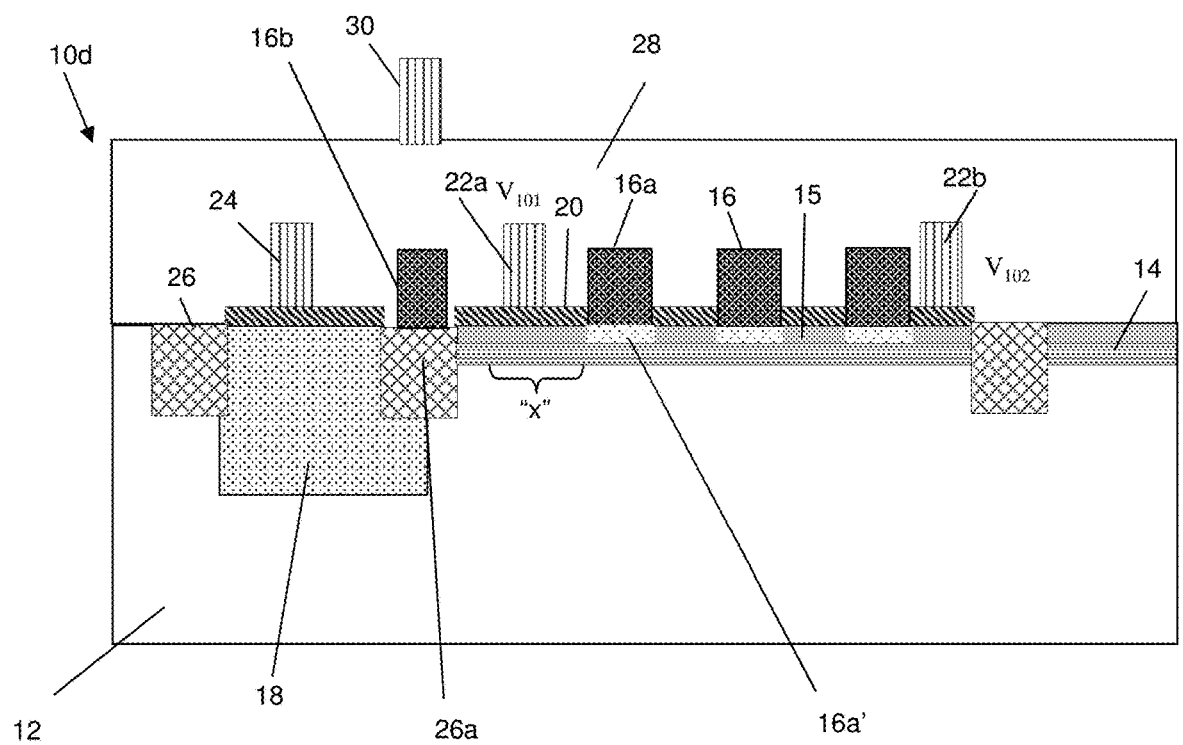

In FIG. 5, the structure 10d is similar to the structure 10c of FIG. 4, with the further addition of a gate 16b directly on the shallow trench isolation region 26a in the well region 18. In embodiments, the gate 16b can be the same structure as the devices 16, 16a. In additional embodiments, the metal line 30 can optionally be used to connect to a voltage source, e.g., above Vt and below the voltage applied to the contact 24. The remaining features of the structure 10c are the same as described with respect to the structure 10a of FIG. 4.

In operation, the gate 16b can be biased above the bulk threshold voltage which enables collection of electrons from beneath the devices 16, 16a. Moreover, in operation, the gate structure 16b is configured to provide a slowly varying voltage to the region as function of RF signal voltage such that the well region 18 provides a virtual drain for electrons beneath the devices 16, 16a, and is isolated from serving as a source by virtual of the gate voltage. Also, upon application of a voltage, the well region 18 becomes more positive than the voltage threshold of the metal gate 16b. Illustratively, the metal gate 16b and/or the metal line 30 can be biased at 0.4V and the well region at 0.8 V. It should be apparent to one skilled in the art that the voltages applied to the gate 16b and the metal line 10 are chosen such that the virtual drain cannot act as a source (i.e., provide inversion carriers) during periods when the RF voltage is greater than the virtual drain voltage plus a bulk threshold voltage.

Figure 6:
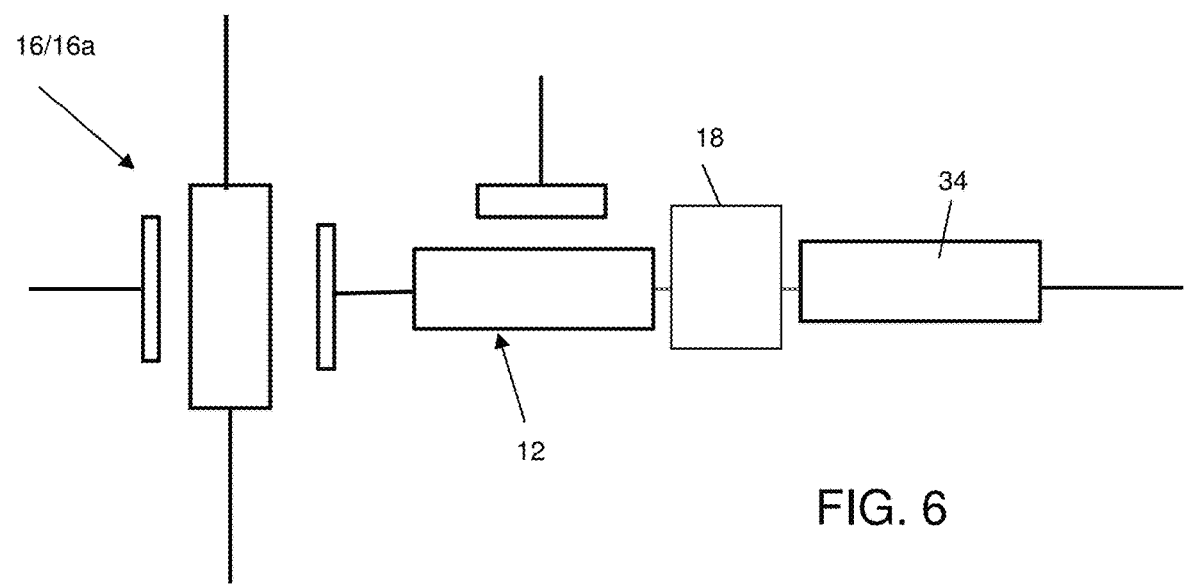
FIG. 6 shows an electrical schematic diagram of a circuit in accordance with aspects of the present disclosure.
Figure 7:
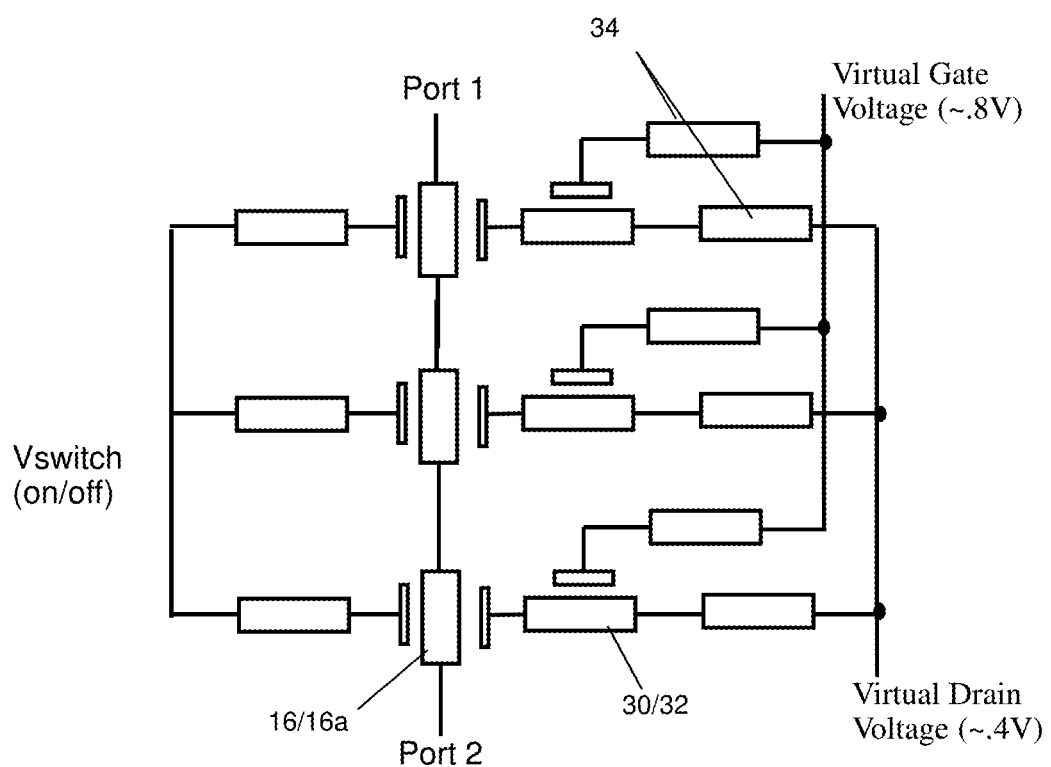
FIG. 7 shows an electrical schematic diagram of a circuit in accordance with additional aspects of the present disclosure.
Figure 8:
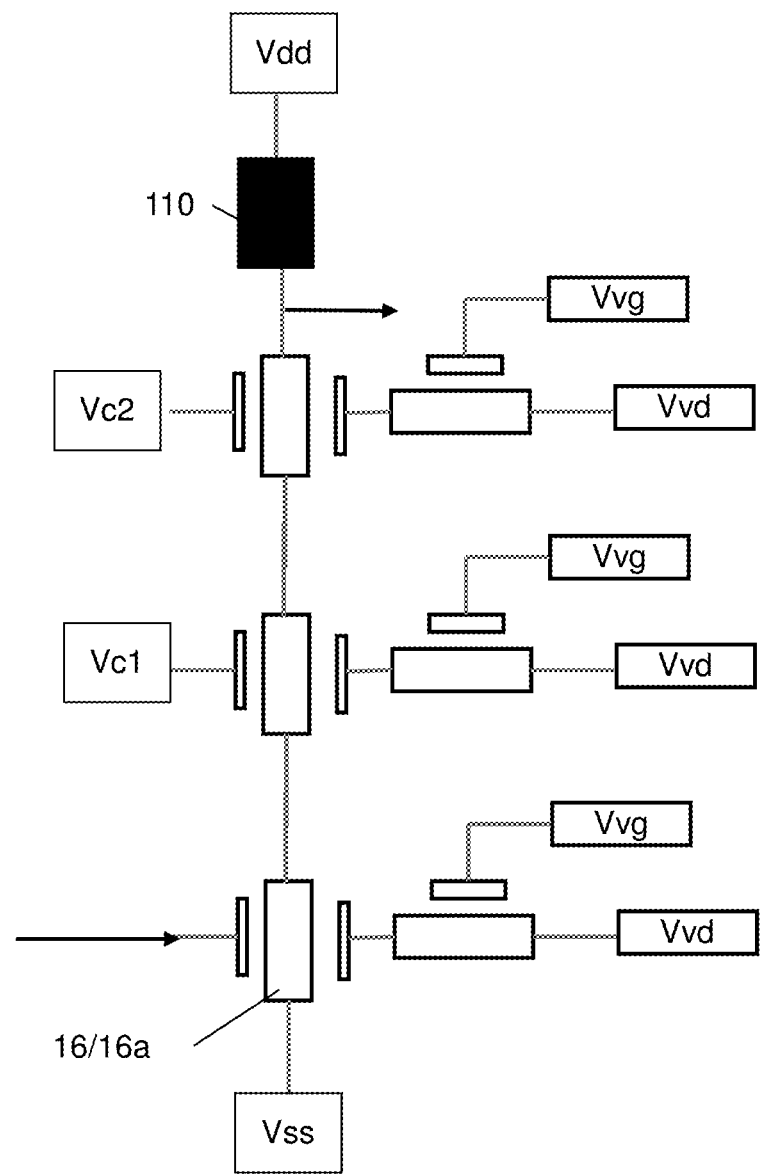
FIG. 8 shows an electrical schematic diagram of a power amplifier circuit in accordance with additional aspects of the present disclosure.

FIGS. 6-8 show electrical schematic diagrams of respective circuits implementing the virtual drain in accordance with aspects of the present disclosure. In FIG. 6, an optional resistor 34 is in series with the well region 18 (e.g., virtual drain). In FIG. 7, the devices 16, 16a and resistors 34 can be a series stack of devices, e.g., FET switches with active gates. Also, as shown in FIG. 7, a series of metal lines 30 and/or gates 32 are also shown. In both FIGS. 6 and 7, the substrate 12 is below the devices 16, 16a, with the electrons from the oxide (insulating layer) being drawn to the virtual drain for Vsurface<0.4V–Vt–bulk. In embodiments, the virtual gate voltage and the virtual drain voltage are each approximately 0.8V. In yet another embodiment, the virtual gate voltage can be 0.4V and the virtual drain voltage can be 0.8V.

FIG. 8 shows an electrical schematic diagram of a power amplifier 100 in accordance with additional aspects of the present disclosure. The power amplifier 100 includes a load 105, e.g., inductor/transformer in a stacked series configuration with devices 16, 16a. In FIG. 8, the load 105 and the devices 16, 16a are positioned between Vdd Vss, with the load 105 between Vdd and a top device 16, 16a. Vvg is the voltage applied to the devices 16, 16a, in the embodiments, which is above the shallow trench isolation structures. Vvd is the voltage applied to the virtual drain (NW). (Vvg and Vvd have similar values). $Vc_1$ and $Vc_2$ are fixed voltages that are applied to the upper two devices 16, 16a of the power amplifier FETs as is known in cascode circuits for power amplifiers. For example, $Vc_1$ may be about 0.3V to 0.5V and $Vc_2$ 0.6 to 0.8V for optimum circuit operation. Optionally a resistor may be included at Vvd and Vvg as in the RF switch case.

While the above description of the virtual drain has been described in the application of an RF switch, it is also applicable to any device constructed above the BOX on which RF signals are applied, and can reduce harmonic distortion by the mechanisms disclosed herein. Such devices may include, but are not limited to inductors, capacitors, transmission lines, transformers, baluns, resistors, varactors, and bipolar transistors. Such devices may be combined to provide functions such as power amplifiers, low-noise amplifiers, or other applications in which harmonic distortion is deleterious to their proper function.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   one or more active devices on a semiconductor on insulator material which is on top of a substrate;
   a virtual drain region comprising a well region within the substrate and spaced apart from an active region of the one or more devices, the virtual drain region configured to be biased to collect electrons which would accumulate in the substrate, and the virtual drain region being spaced apart from a source/drain region of an adjacent device of the one or more active devices;
   a shallow trench isolation region partly within the virtual drain region, wherein an edge of the virtual drain region is remote from an edge of the shallow trench isolation region; and
   a doped skin on the shallow trench isolation region, facing the adjacent device of the one or more active devices.

2. The structure of claim 1, wherein the semiconductor on insulator material is fully depleted and the one or more active deices are fully depleted silicon on insulator transistors.

3. The structure of claim 2, wherein the virtual drain region is a N-type well region below a surface of the substrate.

4. The structure of claim 3, further comprising a contact which applies a voltage bias to the N-type well region, wherein the voltage bias is at least as positive as a DC-averaged RF voltage plus a bulk threshold above ground.

5. The structure of claim 1, wherein the virtual drain region extends to underneath the source/drain region of the adjacent device of the one or more active devices.

6. The structure of claim 1, further comprising a gate structure formed directly on the shallow trench isolation region.

7. The structure of claim 6, wherein the gate structure is a metal which is biased above a bulk threshold voltage, and the virtual drain region is more positive than a threshold of the gate structure.

8. The structure of claim 1, further comprising a contact to the virtual drain region which applies a voltage to the virtual drain region.

9. A structure comprising:
   a substrate;
   an insulating material on the substrate;
   a fully depleted semiconductor material on the insulating material;
   a plurality of active devices on the fully depleted semiconductor material;
   a virtual drain region within the substrate, adjacent to at least active device of the plurality of active devices, and which is spaced apart from a drain/source region of an adjacent active device of the plurality of devices; and
   a contact which biases the virtual drain region to collect electrons from beneath the plurality of active devices; and
   a shallow trench region partially in the virtual drain region and having an edge extending closer to the adjacent active device than the virtual drain region.

10. The structure of claim 9, wherein the virtual drain region is a N-well region.

11. The structure of claim 9, wherein the virtual drain region extends to and overlaps with a drain/source region of the adjacent active device of the plurality of devices.

12. The structure of claim 9, wherein the shallow trench isolation region includes a doped skin at a position closer to the adjacent active device than the virtual drain region.

13. The structure of claim 9, further comprising a gate structure or metal line above the shallow trench isolation region, which provides a voltage bias to the shallow trench isolation region.

14. A structure comprising:
   one or more active devices on a semiconductor on insulator material which is on top of a substrate;
   a virtual drain region comprising a well region within the substrate and spaced apart from an active region of the one or more devices, the virtual drain region configured to be biased to collect electrons which would accumulate in the substrate;
   a shallow trench isolation region partly within the virtual drain region, wherein an edge of the virtual drain region is remote from an edge of the shallow trench isolation region; and
   a metal line formed above the shallow trench isolation region on an insulator material, wherein the metal line provides a voltage bias to the shallow trench isolation region to attract the electrons for collection in the virtual drain region, and the virtual drain region is spaced apart from a source/drain region of an adjacent device of the one or more active devices.

* * * * *

UNITED STATES PATENT AND TRADEMARK OFFICE
CERTIFICATE OF CORRECTION

PATENT NO. : 10,658,390 B2
APPLICATION NO. : 16/031407
DATED : May 19, 2020
INVENTOR(S) : Nowak et al.

It is certified that error appears in the above-identified patent and that said Letters Patent is hereby corrected as shown below:

In the Claims

In Claim 2, Line 3 at Column 8, change "deices" to "devices".

Signed and Sealed this
Fifteenth Day of September, 2020

Andrei Iancu
*Director of the United States Patent and Trademark Office*